United States Patent [19]

Karsten

[11] Patent Number: 4,719,431
[45] Date of Patent: Jan. 12, 1988

[54] AUDIO POWER AMPLIFIER

[76] Inventor: Ralph R. Karsten, 160 S. Wheeler, St. Paul, Minn. 55105

[21] Appl. No.: 854,120

[22] Filed: Apr. 21, 1986

[51] Int. Cl.[4] ............................................. H03F 3/26
[52] U.S. Cl. ..................................... 330/273; 330/123; 330/146; 330/202; 330/203; 330/296; 330/297
[58] Field of Search ................... 330/70, 72, 123, 146, 330/199, 202, 203, 273, 296, 297, 87

[56]  References Cited
U.S. PATENT DOCUMENTS 2,877,310  3/1959  Donald, III ..................... 330/146 X
3,351,866  11/1967  Goldsmith ........................... 330/273

Primary Examiner—James B. Mullins
Attorney, Agent, or Firm—Kinney & Lange

[57] ABSTRACT

A push-pull power amplifier includes a pair of input terminals, a pair of output terminals, a pair of matched output tubes having cathode, plate, and grid terminals, and a pair of output power supplies, all of which are connected to form a bridge circuit. A floating bias supply is coupled between the grid and plate of both output tubes. A first feedback resistor couples the floating bias supply to the cathode of the first output tube. A second feedback resistor couples the floating bias supply to the cathode of the second output tube. The floating bias supply and feedback resistors provide degenerative feedback without affecting power gain.

23 Claims, 4 Drawing Figures

4,719,431

AUDIO POWER AMPLIFIER

BACKGROUND OF THE INVENTION

1. Field of the Invention.

The present invention relates to electronic amplifier circuits. In particular, the present invention is an audio power amplifier which can be directly coupled to a load.

2. Description of the Prior Art.

Power amplifiers are well known and disclosed, for example, in U.S. Pat. Nos. 3,191,126 granted to Fowler in June 1965, 3,042,875 granted to Higginbothan in July 1962, and 4,229,706 granted to Bongiorno in October 1980. Desirable characteristics of audio power amplifiers include a high damping factor, wide frequency response, high transient response, and low overall distortion. The tradeoff in achieving these characteristics is, of course, overall cost of the amplifier.

While the vast majority of audio power amplifiers on the market today are transistorized, extremely high performance audio power amplifiers often use vacuum tubes as output devices. Vacuum tube power amplifiers, however, typically require a matching transformer to match the high impedance of the tube circuits to the low impedance of the loudspeaker load. The matching transformer also prevents the high voltages found in conventional tube circuits from damaging the loudspeaker.

One vacuum electron tube audio power amplifier which does not use a matching transformer at its output is known as the Futterman Amp. This particular amplifier design uses a well known "totem pole" output like many solid-state designs, and shares some of the same weaknesses. Some versions of this amplifier also include coupling capacitors to block harmful DC voltages. The output coupling capacitors, however, adversely affect the slewing response of the amplifier, and also introduce non-linearities into its phase response. As a result, the output coupling capacitors have many of the same limitations as the matching transformers.

Totem pole amplifiers, which comprise the majority of solid-state designs, as well as direct-coupled tube designs, have inferior distortion caracteristics. These distortion characteristics, when coupled to the odd-ordered harmonic distortions of solid-state devices, make totem pole amplifier configurations less than desirable.

It is evident that there is a continuing need for improved audio power amplifiers. An audio power amplifier design which permits the use of vacuum tube output devices which can be directly coupled to a loudspeaker load would be especially desirable. This amplifier must be capable of producing high output power levels over a wide bandwidth with low distortion. Of course, the design must be simple, to allow easy implementation.

SUMMARY OF THE INVENTION

The present invention is a power amplifier which can be directly coupled to a load. The amplifier is capable of producing high output power levels over a wide bandwidth. Overall distortion is also very low. The amplifier requires few components, and is therefore relatively simple to construct.

Included are first and second input terminal means for receiving first and second balanced input signals, respectively, and first and second output terminal means for coupling an output signal to a load. First and second output device means each have first and second terminals and a third control terminal for controlling the flow of electric current. The control terminal of the first output device means is coupled to the first input terminal means, while the control terminal of the second output device means is coupled to the second input terminal means. Floating bias supply means are coupled between the first and control terminals of each of the first and second output device means. The first output terminal means is coupled to the first terminal of the first output device means, while the second output terminal means is coupled to the first terminal of the second output device means. Also included are first and second output power supply means. The first output power supply means is coupled between the second terminal of the first output device means and the second output terminal means. The second output power supply means is coupled between the second terminal of the second output device means and the first output terminal means.

In a preferred embodiment, the first and second output device means each comprise vacuum tubes having a plate, a cathode, and a grid. The bias supply means is coupled to the grid of the first output tube through a first bias supply resistor, and to the grid of the second output tube through a second bias resistor. The bias supply is also coupled to the cathode of the first output tube through a first feedback/bias resistor, and to the cathode of the second output tube through a second feedback/bias resistor. The first input terminal means is coupled to the grid of the first output tube through a first stabilizing resistor, while the second input terminal means is coupled to the grid of the second output tube through a second stabilizing resistor. One of the first and second output terminal means is grounded for operator safety.

DETAILED DESCRIPTION OF THE PREFERRED EMBODIMENTS

Figure 1:
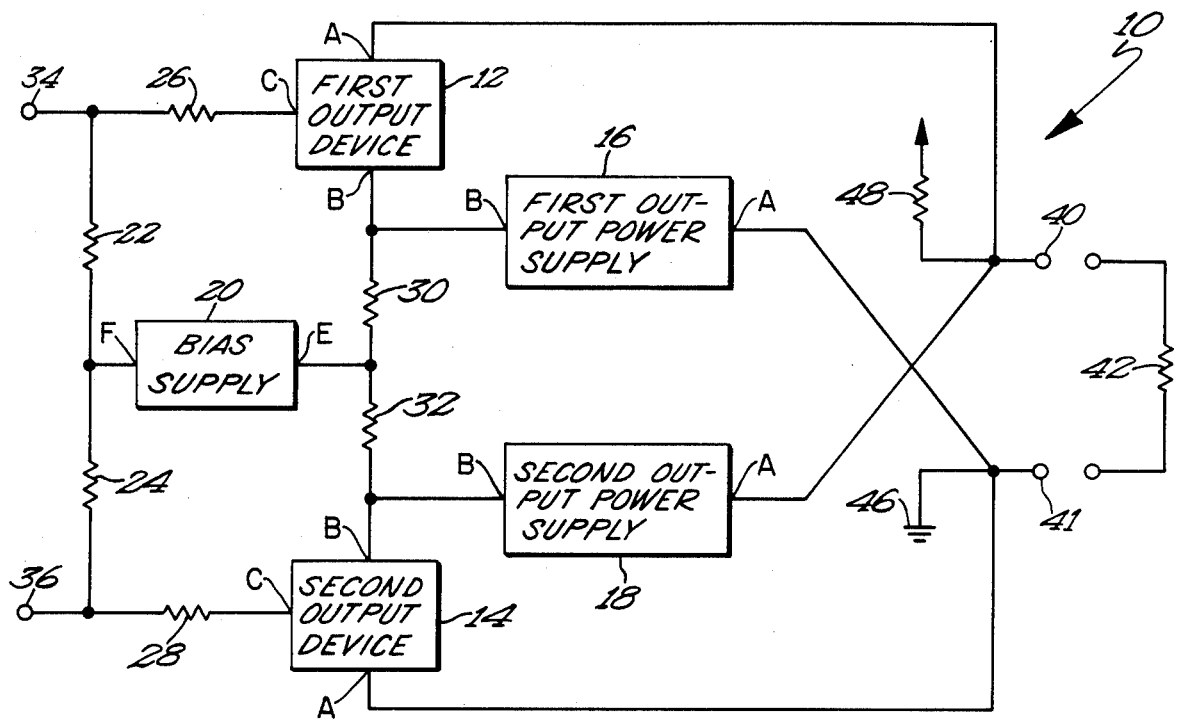
FIG. 1 is a block diagram representation of the power amplifier of the present invention.

Push-pull audio power amplifier 10 of the present invention is illustrated generally in FIG. 1. As shown, amplifier 10 includes first and second output devices 12 and 14, respectively, first and second output power supplies 16 and 18, respectively, and bias supply 20. Also included are first and second bias resistors 22 and 24, first and second stabilizing resistors 26 and 28, and first and second feedback/bias resistors 30 and 32. Amplifier 10 is driven by first and second balanced input signals which are applied to first and second input terminals 34 and 36, respectively. Balanced input signals of this type are 180° out of phase with respect to each other, and circuitry for producing these signals are well known and disclosed in subsequent portions of this specification. An output signal (i.e. an amplified input signal) is coupled from amplifier 10 at first and second output terminals 40 and 41, respectively. The output signal is adapted to drive a load, such as speaker, schematically illustrated as load resistor 42.

Output devices 12 and 14 each include a first or output terminal A, a second or emitter terminal B, and a third or control terminal C. Current flow through each of the output devices 12 and 14, between output terminal A and emitter terminal B, is controlled as a function of a control signal applied to control terminal C. Output terminal A of output device 12 is connected to first output terminal 40, while output terminal A of output device 14 is connected to second output terminal 41. Transistors or electron tubes can be used as output devices 12 and 14, and preferred embodiments of amplifier 10 utilizing both are described in subsequent portions of this specification. Furthermore, although identified with reference to a single block in FIG. 1, output devices 12 and 14 can each comprise several tubes or transistors interconnected in a parallel manner as necessary to produce the desired power levels and output impedance.

Output power supplies 16 and 18 are DC power supplies, and have a first polarity terminal A and a second polarity terminal B. First terminal A of first output power supply 16 is coupled to second output terminal 41, while first terminal A of second output power supply 18 is coupled to first output terminal 40. Second polarity terminal B of first output power supply 16 is coupled to emitter terminal B of first output device 12. Similarly, second polarity terminal B of second output power supply 18 is connected to emitter terminal B of second output device 14. Power supplies 16 and 18 are preferably identical, and can be implemented by circuitry which is well known in the art. These power supplies must be capable of providing the necessary voltage and current levels to achieve the desired output power characteristics of amplifier 10.

Bias supply 20 is a floating DC supply which has a first polarity terminal E and a second polarity terminal F. As shown, bias supply 20 is coupled between control terminal C and emitter terminal B of both output devices 12 and 14. First polarity terminal E of bias supply 20 is coupled to emitter terminal B of output devices 12 and 14 through feedback/bias resistors 30 and 32, respectively. Second polarity terminal F of bias supply 20 is coupled to control terminal C of first output device 12 through first bias resistor 22 and first stabilizing resistor 26. Similarly, second polarity terminal F of bias supply 20 is coupled to control terminal C of second output device 14 through second bias resistor 24 and second stabilizing resistor 28.

Bias supply 20 provides a DC bias potential which floats with respect to input terminals 34 and 36, and first and second output power supplies 16 and 18, respectively. Characteristics of bias supply 20 (e.g. current and voltage levels), along with the resistance of bias resistors 22 and 24 (and to some extent stabilizing resistors 26 and 28), and feedback/bias resistors 30 and 32, all affect the biasing of output devices 12 and 14. These characteristics and resistance values must therefore be chosen so as to bias output devices 12 and 24 within a desired operating region. Typically, bias resistors 22 and 24 will be of a relatively high resistance, such as 100K ohms in a vacuum tube embodiment. Their precise value, of course, depends upon the characteristics bias supply 20, the characteristics of output devices 12 and 14, and the particular operating region in which it is desired to bias output devices 12 and 14. Those skilled in the art can easily select the proper characteristics and resistance values.

Stabilizing resistors 26 and 28 are not required for operation of amplifier 10, but are commonly used to absorb input signal reflections between control terminal C of output devices 12 and 14, and input terminals 34 and 36, respectively. Stabilizing resistors 26 and 28 also serve to reduce recombient distortions when paralleled devices are used. Stabilizing resistors 26 and 28 will therefore have a relatively low resistance, on the order of 100 ohms. Their precise value is, of course, dependant upon characteristics of amplifier 10 and components thereof.

Feedback/bias resistors 30 and 32 isolate first and second output power supplies 16 and 18, respectively, from one another, while at the same time permitting bias supply 20 to reference output devices 12 and 14. Resistance of feedback/bias resistors 30 and 32 must therefore be high enough to achieve this function. On the other hand, resistors 30 and 32 cannot be so large as to interfere with the proper biasing of output devices 12 and 14. In one embodiment, feedback/bias resistors 30 and 32 each have a resistance of 500 ohms. A degenerative feedback signal is developed across feedback/bias resistors 30 and 32 which aids in controlling the stability of amplifier 10.

Either output terminal 40 or 41 of power amplifier 10 can be connected to ground 46 (terminal 41 is shown connected to ground 46 in FIG. 1). This features provides safety to components of amplifier 10, load 42, and to operators of these devices. A negative feedback signal (NF) can also be coupled from one of output terminals 40 and 41 (the NF signal is shown taken from terminal 40 in FIG. 1), such as through a negative feedback resistor 48. Feedback signal NF can be applied to a driver stage (not shown) of amplifier 10 in a well known manner to increase performance.

Due to the unique configuration of power amplifier 10, output devices 12 and 14 can be directly coupled to output terminals 40 and 41, respectively. No resistor or capacitor networks, or matching transformers, are required to match the output impedance of these devices to that of a load 42. The unique configuration of power amplifier 10 also permits the use of matched output devices 12 and 14 of the same conductivity type. NPN or PNP power transistors having matched characteristics can be used for this purpose. Construction, cost, and performance of power amplifier 10 are all facilitated through the use of devices of these types.

Output devices 12 and 14 can be biased to operate in classes A, AB, or B as desired. Operation in Class A has been found to be most effective. In operation, power amplifier 10 provides a push-pull output. As will be described in greater detail in subsequent portions of this specification, power amplifier 10 is configured in such a manner that the current flow from each power supply 16 and 18 will be in opposite directions through load 42. Power amplifier 10 is therefore a differential amplifier in the sense that it is the difference of the currents from output power supplies 16 and 18 that drives load 42. Polarities of first and second output power supplies 16 and 18, respectively, and bias supply 20, are not indicated in FIG. 1 as they are dependent upon the nature of output devices 12 and 14.

Figure 2:
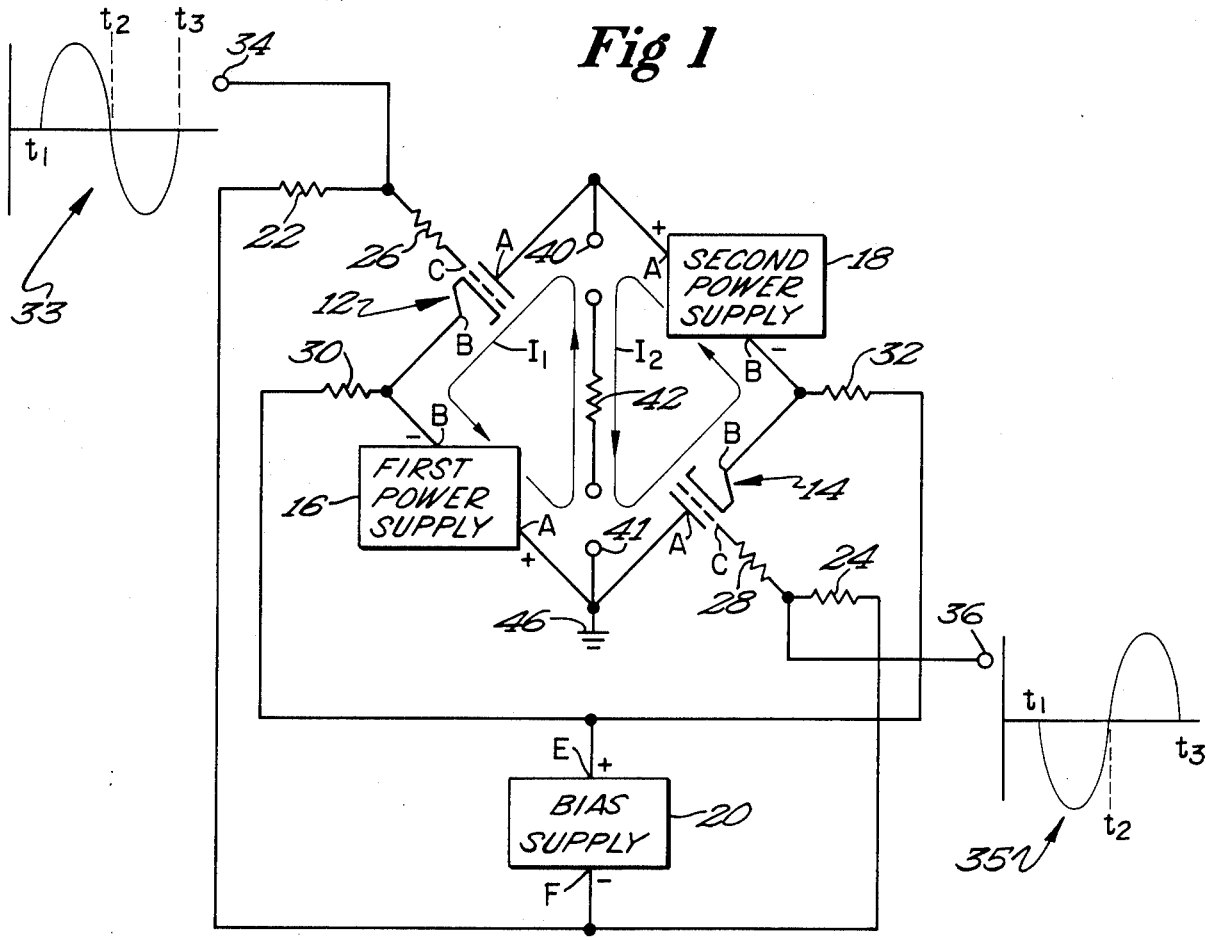
FIG. 2 is a block diagram representation illustrating the bridge configuration of the power amplifier shown in FIG. 1, with electron tubes as the output devices.

FIG. 2 is an illustration of one preferred embodiment of amplifier 10, and is arranged in a manner to show the bridge nature thereof. First and second output devices 12 and 14, respectively, comprise triode electron tubes in this particular embodiment. Output terminals A correspond to the plates, emitter terminals B the cathodes, and control terminals C the grids, of these particular output devices 12 and 14. As a result of the electrical characteristics of the triode electron tubes, first polarity terminal A of power supplies 16 and 18 are positive (+) terminals, while second polarity terminals B are the negative (−) terminals. To properly bias these devices, first polarity terminal E of bias supply 20 is the positive (+) terminal, while second polarity terminal F is the negative (−) terminal.

Wave forms of first and second balanced input signals are represented generally at reference numerals 33 and 35, respectively. As shown, first input signal 33 is applied to first input terminal 34, while second input signal 35 is applied to second input terminal 36. First input signal 33 controls a first current $I_1$ from first output power supply 16 through load 42 and first output device 12, i.e., the triode electron tube. Similarly, second input signal 35 controls a second current $I_2$ from second power supply 18 through load 42 and second output device 14, i.e., the triode electron tube. As shown, currents $I_1$ and $I_2$ are in directions opposite to one another through load 42, thereby giving power amplifier 10 its differential characterics.

When first input signal 33 has a positive value, period $t_1$-$t_2$, control terminal C of first output device 12, i.e., the grid of the tube, causes first current $I_1$ to increase from a quiescent value to a maximum value, and then decrease back to its quiescent value, proportionately with the magnitude of the input signal. During period $t_2$-$t_3$ first input signal 33 has a negative value, and causes first current $I_1$ to decrease from its quiescent value and then increase back to its quiescent value proportionately with the magnitude of input signal 33. Depending upon the particular biasing arrangement of the electron tube, the tube may be cut off and current $I_1$ reduced to zero before input signal 33 reaches its minimum value. Second input signal 35 causes second output device 14, i.e., the electron tube, to control current $I_2$ in a similar manner.

Figure 3:
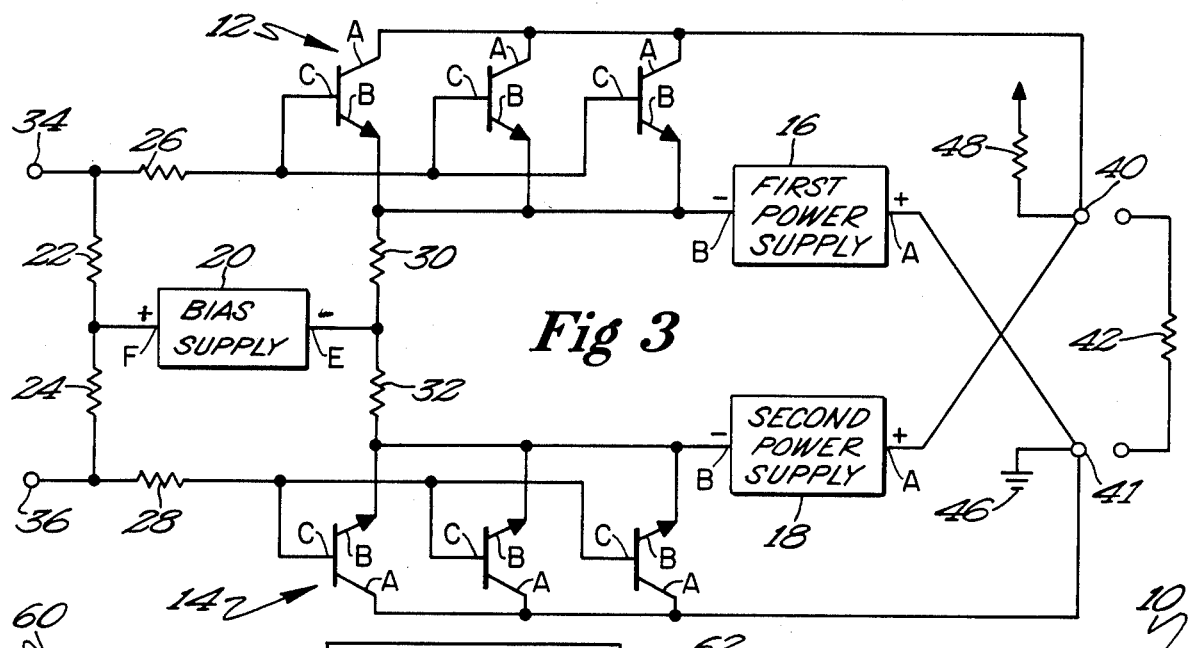
FIG. 3 is a block diagram illustration of the amplifier shown in FIG. 1, with bipolar transistors as the output devices.

A second transistorized version of power amplifier 10 is illustrated schematically in FIG. 3. As shown, first output device 12 comprises three transistors. Similarly, second output device 14 is formed by three transistors. In the embodiment shown, the transistors are NPN bipolar transistors, each of which includes a base which correspond to control terminals C, an emitter which corresponds to emitter terminals B, and a collector which corresponds to output terminals A, respectively, of output devices 12 and 14. As a result of the electrical characteristics of the NPN transistors, first polarity terminal A of first and second power supplies 16 and 18, respectively, are positive (+), while second polarity terminals B are negative (−). First polarity terminal E of bias supply 20 is negative (−), while second polarity terminal F is positive (+). The embodiment of power amplifier 10 operates in a manner very much like the embodiment shown in FIG. 2, with the transistors performing the function of the tubes already described.

Figure 4:
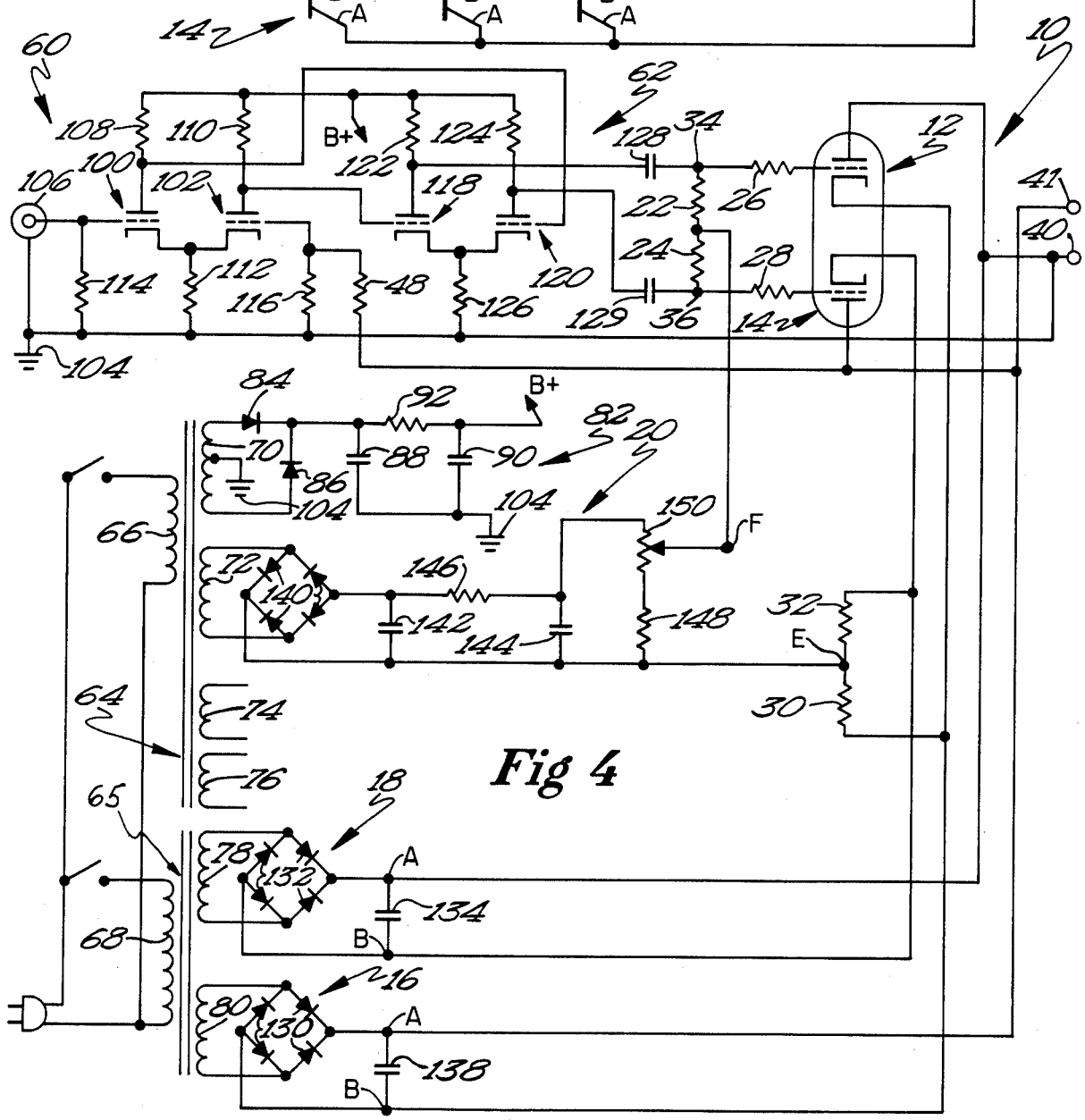
FIG. 4 is a detailed schematic representation of the power amplifier shown in FIG. 1, as well as a voltage amplifier and driver for use therewith.

A third preferred embodiment of power amplifier 10 is schematically illustrated in FIG. 4 along with a voltage amplifier 60 and driver 62. All supply potentials for amplifier 10, voltage amplifier 60 and driver 62 are provided by transformer 64 which includes primary winding 66, and secondary windings 70, 72, 74, and 76, and transformer 65 which has primary winding 68 and secondary windings 78 and 80. A B+ power supply 82 provides a B+ supply to voltage amplifier 60 and driver 62. B+ supply 82 is powered by grounded center-tap secondary winding 70, and includes diodes 84 and 86, capacitors 88 and 90, and resistor 92. In one preferred embodiment, B+ supply 82 is a 400 volt supply.

Voltage amplifier 60 and driver 62 are both connected to receive the B+ supply, as shown. Voltage amplifier 60 is preferably formed by an electron tube which includes two matched triodes 100 and 102. A supply for filaments (not shown) of tubes 100 and 102 is provided by secondary winding 74 of transformer 64. An input signal received at an input jack 106 and referenced to ground 104 is applied directly to a grid of triode 100. Plates of triodes 100 and 102 are connected to B+ supply 82 through resistors 108 and 110, respectively. Cathodes of both triodes 100 and 102 are connected to ground 104 through resistor 112. Grids of triodes 100 and 102 are connected to ground 104 through resistors 114 and 116, respectively.

Driver 62 is preferably formed by a 12BH7 tube which includes a matched pair of triode electron tubes 118 and 120. Filaments (not shown) of tubes 118 and 120 are powered by a 6.3 volts supply provided by secondary winding 74. Plates of both electron tubes 118 and 120 are connected to B+ supply 82 through resistors 122 and 124, respectively. A grid of electron tube 118 is connected to the plate of electron tube 102, while the grid of tube 120 is connected to the plate of electron tube 100. Cathodes of both tubes 118 and 120 are connected to ground 104 through resistor 126.

Voltage amplifier 60 and driver 62 amplify or increase the voltage of the input signal received at input jack 106, and split the phase of the input signal so as to produce the balanced input signals used to drive power amplifier 10. The balanced input signals are taken from the plates of electron tubes 118 and 120, and capacitively coupled by capacitors 128 and 129, respectively, to input terminals 34 and 36 of power amplifier 10.

In the embodiment shown in FIG. 4, first and second output power supplies 16 and 18, respectively, are formed by full-wave rectifier circuits. First power supply 16 includes four diodes 130 which are connected in a bridge arrangement to secondary winding 80 of transformer 65, and capacitor 138. Positive and negative terminals A and B, respectively, of power supply 16 are also shown. Second output power supply 18 includes four diodes 132 which are interconnected in a bridge arrangemnt to secondary winding 78, and capacitor 134. Positive and negative terminals A and B, respectively, of power supply 18 are also shown. In one preferred embodiment, output power supplies 16 and 18 are 135 volt supplies capable of producing 1.7 amps, continuous.

Bias supply 20 is also a full wave rectifier circuit, and is connected to secondary winding 72 of transformer 64. As shown, bias supply 20 includes diodes 140 which are interconnected in a bridge arrangement, capacitors 142 and 144, resistors 146 and 148, and potentiometer 150. Potentiometer 150 can be adjusted to set the precise bias voltage. Bias supply 20 preferably produces a floating 60 volt supply potential. Positive and negative terminals E and F of bias supply 20 are also shown.

First output device 12 and second output device 14 of power amplifier 10 shown in FIG. 4 are triode electron tubes. In one preferred embodiment, the two triodes are separate sections of ten 6 AS7 tubes which are interconnected in parallel. Filaments of these tubes are powered by secondary winding 76. Plates of the triodes forming first output device 12 are connected to output terminal 40 and to positive terminal A of second output power supply 18. Grids of the tubes forming first output device 12 is connected to input terminal 34 through first stabilizing resistor 26, while the cathodes of the tubes are connected to a negative terminal B of first output power supply 16. Plates of the electron tubes forming second output device 14 are connected to output terminal 41 and to positive terminal A of first output power supply 16. Grids of the electron tubes forming second output device 14 are connected to second input terminal 36 through stabilizing resistor 28, while the cathodes of these tubes are connected to negative terminal B of second output power supply 18. In one preferred embodiment, stabilizing resistors 26 and 28 each have a resistance of 100 ohms.

First bias resistor 22 is interconnected between input terminal 34 and negative terminal F of bias supply 20. Similarly, bias resistor 24 is interconnected between negative terminal F of bias supply 20 and input terminal 36. Both bias resistors 22 and 24 can have a resistance of 100K ohms in one preferred embodiment. Positive terminal E of bias supply 20 is connected to the cathode of the triode forming first output device 12, and negative terminal B of first output power supply 16 through feedback/bias resistor 30. Similarly, positive terminal E of bias supply 20 is connected to the cathode of the triode forming second output device 14, and to negative terminal B of second output power supply 18 through feedback/bias resistor 32. Feedback/bias resistors 30 and 32 can each have a resistance of 500 ohms in a preferred embodiment.

In this third embodiment of the invention as shown, a negative feedback signal NF is coupled from output terminal 41 to the grid of triode 102 of voltage amplifier 60 through negative feedback resistor 48. Output terminal 40 is also connected to ground 104. Tests have shown that power amplifier 10 illustrated in FIG. 4 has excellent characteristics. It will produce 100 watts when operating class A, or 130 watts with a booster power supply voltage and operation in class $AB_1$. The amplifier has a 1 watt bandwidth of 3 to 3.5 MHz. Full power bandwidth is 10–400K Hz. Overall distortion is also extremely low.

Although the present invention has been described with reference to preferred embodiments, those skilled in the art will realize that changes may be made in form and detail without departing from the spirit and scope of the invention.

What is claimed is:

1. A power amplifier, including:
   first and second input terminal means for receiving first and second balanced input signals, respectively;
   first and second output device means for controlling the flow of electric current and having first and second terminals and a third control terminal, wherein the third control terminal of the first output means is coupled to the first input terminal means, and the third control terminal of the second output device means is coupled to the second input terminal means;
   floating bias supply means for providing a floating bias potential coupled between the second and third control terminals of the first and second output device means;
   first and second feedback impedance means for opposing the flow of electric current, wherein the first feedback impedance means is coupled between the bias supply means and the second terminal of the first output device means, and the second feedback impedance means is coupled between the bias supply means and the second terminal of the second output device means;
   first and second output terminal means for coupling an output signal from the power amplifier, wherein the first output terminal means is coupled to the first terminal of the first output device means, the second output terminal means is coupled to the first terminal of the second output device means; and
   first and second output power supply means for providing first and second output power supplies, respectively, wherein the first output power supply means is coupled between the second terminal of of the first output device means and the second output terminal means, and the second output power supply means is coupled between the second terminal of the second output device means and the first output terminal means.

2. The power amplifier of claim 1 wherein the first and second output device means comprise first and second electron tube means for controlling electric current.

3. The power amplifier of claim 2 wherein the first and second electron tube means are matched.

4. The power amplifier of claim 2 wherein the first and second electron tube means comprise triodes.

5. The power amplifier of claim 1 wherein the first and second output device means comprise first and second transistor means for controlling electric current.

6. The power amplifier of claim 5 wherein the first and second transistor means are matched.

7. The power amplifier of claim 6 wherein the first and second transistor means are bipolar transistors.

8. The power amplifier of claim 7 wherein the first and second transistor means are NPN bipolar transistors.

9. The power amplifier of claim 1 and further including first and second bias resistors, wherein the first bias resistor is interconnected between the floating bias supply means and the control terminal of the first output device means, and the second bias resistor is interconnected between the floating bias supply means and the control terminal of the second output device means.

10. The power amplifier of claim 1 and further including first and second stabilizing resistors, wherein the first stabilizing resistor is interconnected between the first input terminal means and the control terminal of the first output device means, and the second stabilizing resistor is interconnected between the second input terminal means and the control terminal of the second output device means.

11. The power amplifier of claim 1 and further including driver circuit means for providing the first and second balanced input signals.

12. The power amplifier of claim 11 and further including negative feedback means for coupling a negative feedback signal from the power amplifier to the driver circuit means.

13. The power amplifier of claim 12 wherein the negative feedback means includes a negative feedback resistor interconnected between one of the first and second output terminal means and the driver circuit means.

14. The power amplifier of claim 1 wherein the first and second feedback impedance means include first and second feedback resistors coupled between the bias supply means and the output device means.

15. The power amplifier of claim 1 and further including means for referencing one of the first and second output terminal means to a ground potential.

16. An audio power amplifier, including
first and second input terminals for receiving first and second balanced input signals, respectively;
first and second output electron tube means for controlling electric current, each having a plate, a cathode, and a grid, wherein the grid of the first tube means is coupled to the first input terminal, and the grid of the second tube means is coupled to the second input terminal;
first and second output power supplies, each having a positive and a negative terminal, wherein the negative terminal of the first output power supply is coupled to the cathode of the first output tube means, and the negative terminal of the second output power supply is coupled to the cathode of the second output tube means;
first and second output terminals, wherein the first output terminal is coupled to the plate of the first output tube means and to the positive terminal of the second output power supply, the second output terminal is coupled to the plate of the second output tube means and to the positive terminal of the first output power supply;
a floating bias supply having positive and negative terminals;
first and second bias resistors, wherein the first bias resistor is coupled between the positive terminal of the bias supply and the grid of the first output tube, and the second bias resistor is coupled between the positive terminal of the bias supply and the grid of the second output tube; and
first and second bias/feedback resistors, wherein the first bias/feedback resistor is coupled between the positive terminal of the bias supply and the cathode of the first output tube, and the second bias/feedback resistor is coupled between the positive terminal of the bias supply and the cathode of the second output tube.

17. The audio power amplifier of claim 16 and further including first and second stabilizing resistors, wherein the first stabilizing resistor is coupled between the first input terminal and the grid of the first output tube, and the second stabilizing resistor is coupled between the second input terminal and the grid of the second output tube.

18. The audio power amplifier of claim 16 and further including means for referencing one of the first and second output terminals to a ground potential.

19. A push-pull power amplifier of the type having first and second output device means each having first and second terminals forming a main current flow path and a control terminal, and a pair of power supplies, connected in a bridge circuit between a pair of input terminals and a pair of output terminals, wherein the amplifier is characterized by floating bias means coupled between the second and control terminals of the first and second output device means, for providing a floating bias potential, first feedback impedance means for opposing the flow of electric current connected between the floating bias means and the second terminal of the first output device means, and second feedback impedance means for opposing the flow of electric current coupled between the floating bias means and the second terminal of the second output device means.

20. The push-pull power amplifier of claim 19 wherein the first and second feedback impedance means include resistors directly interconnected between the bias means and the second terminals of the first and second output device means.

21. The push-pull power amplifier of claim 19 wherein the output device means include electron tubes.

22. The push-pull power amplifier of claim 19 wherein the output device means include transistors.

23. The push-pull power amplifier of claim 19 and further including means for referencing one of the first and second output terminals means to ground.

* * * * *

UNITED STATES PATENT AND TRADEMARK OFFICE
CERTIFICATE OF CORRECTION

PATENT NO. : 4,719,431

DATED : January 12, 1988

INVENTOR(S) : Ralph R. Karsten

It is certified that error appears in the above-identified patent and that said Letters Patent is hereby corrected as shown below:

On the front page of the patent, delete the References Cited section and insert therefore:

[56]                  References Cited

U.S. PATENT DOCUMENTS

| | | | |
|---|---|---|---|
| 2,877,310 | 3/1959 | Donald, III. | 330/146 X |
| 3,042,875 | 7/1962 | Higginbotham. | 330/17 |
| 3,191,126 | 6/1965 | Fowler. | 330/9 |
| 3,351,866 | 11/1967 | Goldsmith | 330/273 |
| 4,229,706 | 10/1980 | Bongiorno. | 330/272 |

OTHER PUBLICATIONS

"Equipment Profile", Audio Magazine, December 1983, pp. 70-72.

Signed and Sealed this

Twenty-fourth Day of May, 1988

Attest:

DONALD J. QUIGG

Attesting Officer      Commissioner of Patents and Trademarks